United States Patent
Kohyama

(10) Patent No.: US 6,812,542 B2
(45) Date of Patent: Nov. 2, 2004

(54) ELECTRIC FUSE WHOSE DIELECTRIC BREAKDOWN RESISTANCE IS CONTROLLED BY INJECTING IMPURITIES INTO AN INSULATING FILM OF A CAPACITOR STRUCTURE, AND A METHOD FOR MANUFACTURING THE SAME

(75) Inventor: Yusuke Kohyama, Yokosuka (JP)

(73) Assignee: Kabushiki Kaisha Toshiba, Kamasaki (JP)

( * ) Notice: Subject to any disclaimer, the term of this patent is extended or adjusted under 35 U.S.C. 154(b) by 6 days.

(21) Appl. No.: 09/892,713

(22) Filed: Jun. 28, 2001

(65) Prior Publication Data

US 2002/0003280 A1 Jan. 10, 2002

(30) Foreign Application Priority Data

Jun. 28, 2000 (JP) ....................................... 2000-194742

(51) Int. Cl.[7] .............................................. H01L 29/00
(52) U.S. Cl. ...................... 257/530; 257/409; 257/528
(58) Field of Search ................................ 257/409, 528, 257/529, 530

(56) References Cited

U.S. PATENT DOCUMENTS 5,237,196 A * 8/1993 Mikata et al.
5,783,467 A   7/1998 Han et al.
5,793,094 A   8/1998 Sanchez et al.
5,866,937 A   2/1999 McCollum
5,903,042 A   5/1999 Kwok et al.
5,913,138 A   6/1999 Yamaoka et al.
6,094,386 A   7/2000 Kohyama
6,096,580 A * 8/2000 Iyer et al.
6,333,232 B1 * 12/2001 Kunikiyo

FOREIGN PATENT DOCUMENTS

JP  05211221 A * 8/1993
JP  5-343528    12/1993

* cited by examiner

Primary Examiner—Long Pham
(74) Attorney, Agent, or Firm—Banner & Witcoff, Ltd.

(57) ABSTRACT

A semiconductor device comprises capacitor structures, each having a first lower electrode, a first insulating film formed on the first lower electrode and a first upper electrode formed on the first insulating film, and electric fuse elements, each having a second lower electrode, a second insulating film formed on the second lower electrode and having an impurity concentration higher than that of the first insulating film, and a second upper electrode formed on the second insulating film. The electric fuse elements have substantially the same structure as that of the capacitor structures, and they are formed on the same level as that of the capacitor structures. A writing voltage of the electric fuse element is determined by dielectric breakdown resistance of the second insulating film, which depends on the impurity concentration of the second insulating film.

3 Claims, 14 Drawing Sheets

ELECTRIC FUSE WHOSE DIELECTRIC BREAKDOWN RESISTANCE IS CONTROLLED BY INJECTING IMPURITIES INTO AN INSULATING FILM OF A CAPACITOR STRUCTURE, AND A METHOD FOR MANUFACTURING THE SAME

CROSS-REFERENCE TO RELATED APPLICATIONS

This application is based upon and claims the benefit of priority from the prior Japanese Patent Application No. 2000-194742, filed Jun. 28, 2000, the entire contents of which are incorporated herein by reference.

BACKGROUND OF THE INVENTION

The present invention relates to an electric fuse whose dielectric breakdown resistance is controlled by injecting impurities into an insulating film of a capacitor structure, and a method for manufacturing the same, and particularly relates to an electric fuse for use in redundancy technique.

In recent years, as the technologies for manufacturing semiconductor devices are advancing, the semiconductor devices have been more miniaturized and highly integrated on a large scale. However, with alternation of generations of the integration level, it has become difficult to keep the manufacturing yield the same as that of the previous generation. The redundancy technique has been noticed as a method for improving the manufacturing yield of semiconductor devices. In this technique, a fuse element is provided inside a semiconductor device in order to relieve a semiconductor element that becomes partially defective. If a defect occurs in a semiconductor element of a chip, a fuse element corresponding to the defective portion is cut and the semiconductor element is replaced with a spare, so that the yield of the overall chip can be improved.

A laser fuse is a kind of the fuse elements as mentioned above. In the laser fuse, a metal wiring layer is melted by laser irradiation (laser blow), so that information corresponding to the defective portion can be written in the laser fuse. However, when the laser fuse is used, even if a new defect occurs in downstream processes after the laser blow (for example, a packaging process), the new defective portion cannot be released. In this case, since the chip, which will finally be disposed of as a defective product, is subjected to the laser blow, the cost will be wasted.

In contrast, with an electric fuse which can be electrically cut or short-circuit, a defective element can be replaced with a spare even after completion of the packaging process. Therefore, the manufacturing yield can be improved as that in the case where the laser fuse is used. Further, since the chip, which becomes defective in the packaging process, is not replaced with a spare, the electric fuse is efficient and effective redundancy means. An anti-fuse using a capacitor structure is a kind of the electric fuse. With the anti-fuse, a high voltage is applied to the capacitor structure (fuse capacitor) to break a dielectric film, thereby electrically short-circuiting the fuse capacitor, so that information can be written in the anti-fuse.

A structure of the anti-fuse and a method for manufacturing the same will be described with reference to FIGS. 1A to 1C. FIGS. 1A to 1C are cross-sectional views sequentially showing the steps for manufacturing an anti-fuse having a MOS structure.

First, as shown in FIG. 1A, an element isolating region 11 is formed in a circuit region A1 and a peripheral region A2 of a silicon substrate 10. The circuit region is a region where essential circuit elements, such as MOS transistors, are to be formed, and the peripheral region is a region where anti-fuses are to be formed. A gate insulating film 12 and a polycrystalline silicon film 13a are formed on the silicon substrate 10.

Then, as shown in FIG. 1B, a tungsten film 13b is formed on the polycrystalline silicon film 13b.

Thereafter, as shown in FIG. 1C, the polycrystalline silicon film 13a and the tungsten film 13b are patterned to form gate electrodes 13.

Subsequently, in the circuit region A1, impurity diffusion layers to serve as source and drain regions (not shown) are formed in the silicon substrate 10. As a result, a MOS transistor is formed in the circuit region A1. At the same time, an anti-fuse, having a capacitor structure including the gate electrode 13, the gate insulating film 12 and the silicon substrate 10, is formed in the peripheral region A2.

In the anti-fuse having the MOS structure as described above, a high voltage is applied across the gate electrode 13 and the silicon substrate 10, resulting in dielectric breakdown of the gate insulating film 12 to bring about a conduction state, so that information can be written in the anti-fuse.

The anti-fuse is also used, for example, when a defective memory cell is replaced with a redundant memory cell in a DRAM (Dynamic Random Access Memory), which has become highly integrated on a large scale. FIGS. 2A to 2C are cross-sectional views sequentially showing steps for manufacturing a DRAM in which a double-sided cylinder type stack capacitor is used as a cell capacitor.

First, as shown in FIG. 2A, an element isolating region 11 is formed in a memory cell array region A1 and a peripheral region A2 of a silicon substrate 10 by means of the conventional art. Then, a gate insulating film 12 is formed on the silicon substrate 10. Thereafter, a gate electrode 13 is formed on the gate insulating film 12 in the memory cell array region A1. Further, an impurity diffusion layer 14 is formed in that portion of the silicon substrate 10 that is located between the adjacent gate electrodes 13, with the result that a cell transistor is formed. In the peripheral region A2, an impurity diffusion layer 14, to be connected to one of the electrodes of the anti-fuse, is formed in the semiconductor substrate 10. An interlayer insulating film 15 for covering the cell transistor is formed on the silicon substrate 10. Subsequently, in the memory cell array region A1, a bit line 17 connected to the drain region of the cell transistor is formed in the interlayer insulating film 15. Thereafter, an interlayer insulating film 16 is formed on the interlayer insulating film 15. Contact plugs 18 connected to the source region of the cell transistor and the impurity diffusion layer 14 of the peripheral region A2, and capacitor lower electrodes 19 of double-sided cylinder type connected to the contact plugs 18 are formed.

Then, as shown in FIG. 2B, a capacitor insulating film 20 and a capacitor upper electrode 21 are successively formed on the capacitor lower electrode 19. The resultant structure is patterned to a desired wiring pattern. Through this process, a cell capacitor and a fuse capacitor are formed respectively in the memory cell array region A1 and the peripheral region A2.

Thereafter, an interlayer insulating film 22 for covering the cell capacitor and the fuse capacitor and a metal wiring layer (not shown) is formed by the conventional technique, so that the structure shown in FIG. 2C is completed.

In the case of the aforementioned anti-fuse in the DRAM, a high voltage is applied across the capacitor lower electrode 19 and the capacitor upper electrode 21, thereby causing dielectric breakdown of the capacitor insulating film 20 to write information into the anti-fuse.

In general, as described above, the anti-fuse is formed in the process for forming another circuit element, utilizing the structure of the circuit element, for the following reason. The anti-fuse is a mere backup element for the essential function of the semiconductor device. If a manufacturing process for forming only an anti-fuse is added, the overall process will be complicated and troublesome, resulting in nothing but an increase in manufacturing cost.

Thus, since the anti-fuse is formed by utilizing the structure of another circuit element, it has the same characteristics as those of the circuit element. In the above example, the anti-fuse has the same characteristics as those of the gate portion of the MOS transistor or the cell capacitor.

However, the characteristics required for the MOS transistor or the cell capacitor are naturally different from those required for the anti-fuse. More specifically, the MOS transistor and the cell capacitor require a high dielectric breakdown resistance to ensure the reliability as a circuit element. To the contrary, the anti-fuse requires a low dielectric breakdown resistance, so that the fuse can be broken with the lowest possible voltage.

In other words, the same capacitor structures produced by the same process are required to achieve both a dielectric breakdown resistance that can at least ensure the performance as a MOS transistor or a cell capacitor and a dielectric breakdown resistance that can ensure the function of an anti-fuse to write information at a low voltage.

For example, assumed that the limit value of the dielectric breakdown resistance, which ensures the performance of the anti-fuse, is DV1, and the lowest dielectric breakdown resistance, which ensures the performance of the MOS transistor or the cell capacitor, is DV2. In this case, the dielectric breakdown resistances of the capacitor structures must be set within the range between an upper limit of DV1 and a lower limit of DV2.

As described above, the conventional anti-fuse must be developed under limited process conditions.

Further, in the early stages of the development of a DRAM, the cell capacitor does not have performance that can ensure the reliability. As the development advances, the performance is approaching to the objective. On the other hand, the technical development of an anti-fuse is started only in the later stages of the development at which the cell capacitor reaches the objective performance. For this reason, the period of development of the DRAM is inevitably long.

BRIEF SUMMARY OF THE INVENTION

A semiconductor device according to an aspect of the present invention comprises:

capacitor structures, each having a first gate insulating film formed on a semiconductor substrate of a first conductivity type, and a first gate electrode formed on the first gate insulating film; and electric fuse elements, each having a second gate insulating film formed on the semiconductor substrate and having an impurity concentration higher than that of the first gate insulating film, and a second gate electrode formed on the second gate insulating film, wherein information is written in the electric fuse element depending on whether the second gate insulating film is dielectrically broken down, and a writing voltage of the electric fuse element is determined by dielectric breakdown resistance of the second gate insulating film which depends on the impurity concentration of the second gate insulating film; and an impurity diffusion layer of a second conductivity type, which is formed in at least a portion of the semiconductor substrate, the impurity diffusion layer being paired with the second gate electrode and serving as one electrode of the electric fuse element.

A method for fabricating an electric fuse according to an aspect of the present invention comprises:

forming an insulating film on a first electrode;

forming a second electrode on the insulating film; and injecting by ion injection an impurity into at least a portion of the insulating film or passing the impurity therethrough, thereby controlling dielectric breakdown resistance of the insulating film to set a writing voltage.

DETAILED DESCRIPTION OF THE INVENTION

Figures 1A, 1B, 1C:
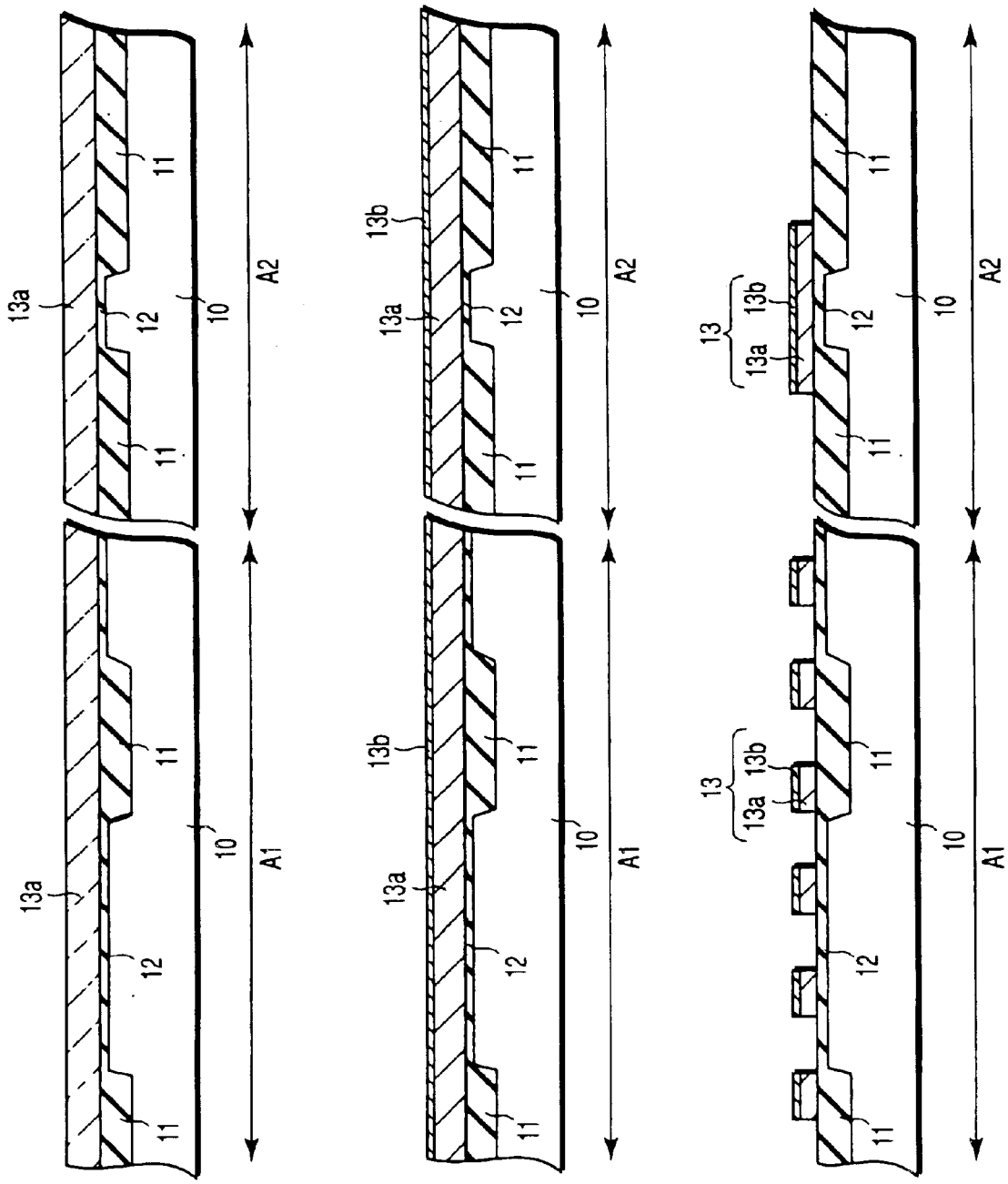
FIGS. 1A to 1C are cross-sectional views showing steps for manufacturing a semiconductor device having a conventional anti-fuse utilizing a MOS structure.
Figure 2A:
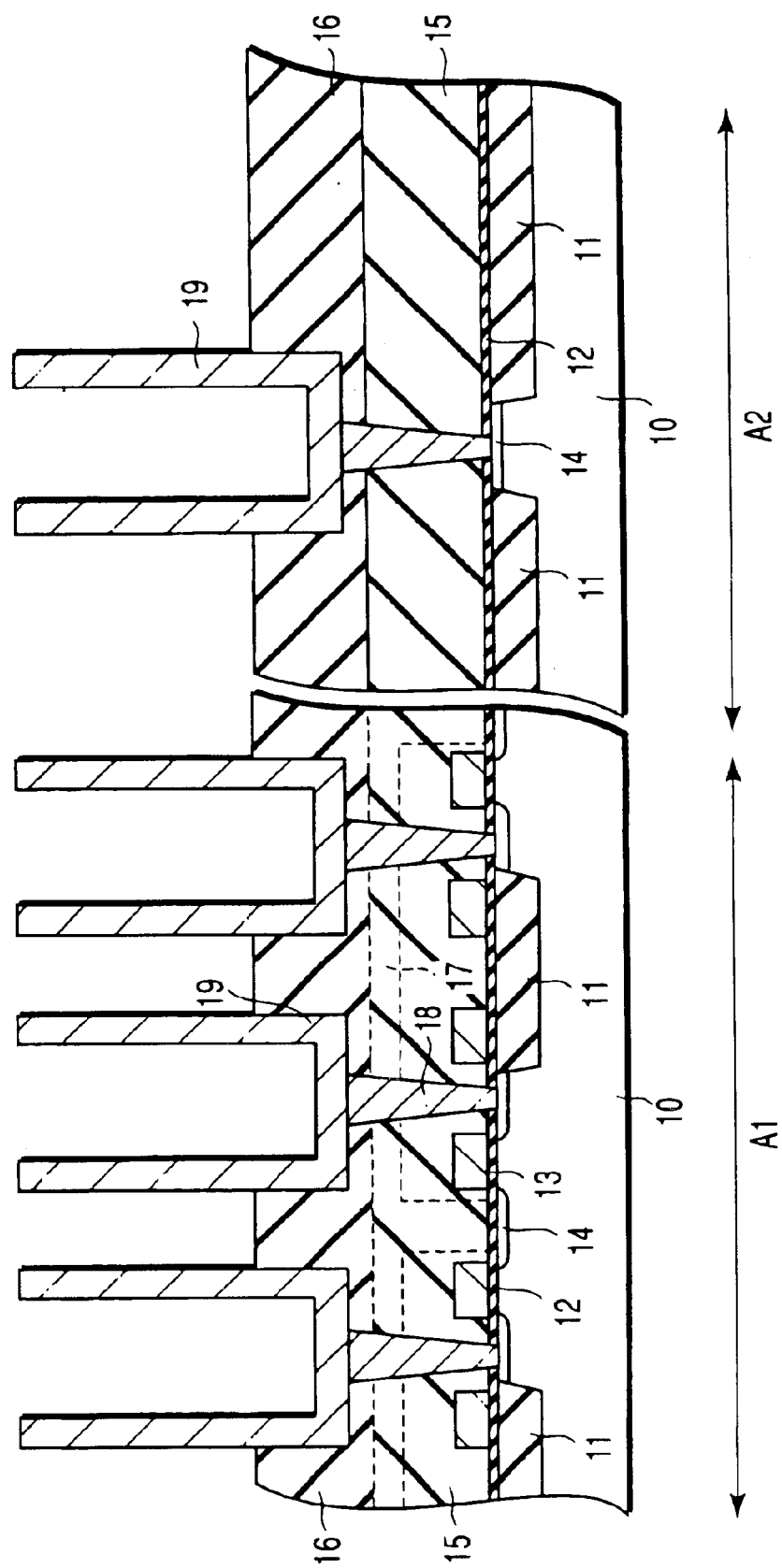
FIGS. 2A to 2C are cross-sectional views showing steps for manufacturing a semiconductor device having a conventional anti-fuse utilizing a cell capacitor structure.
Figure 2B:
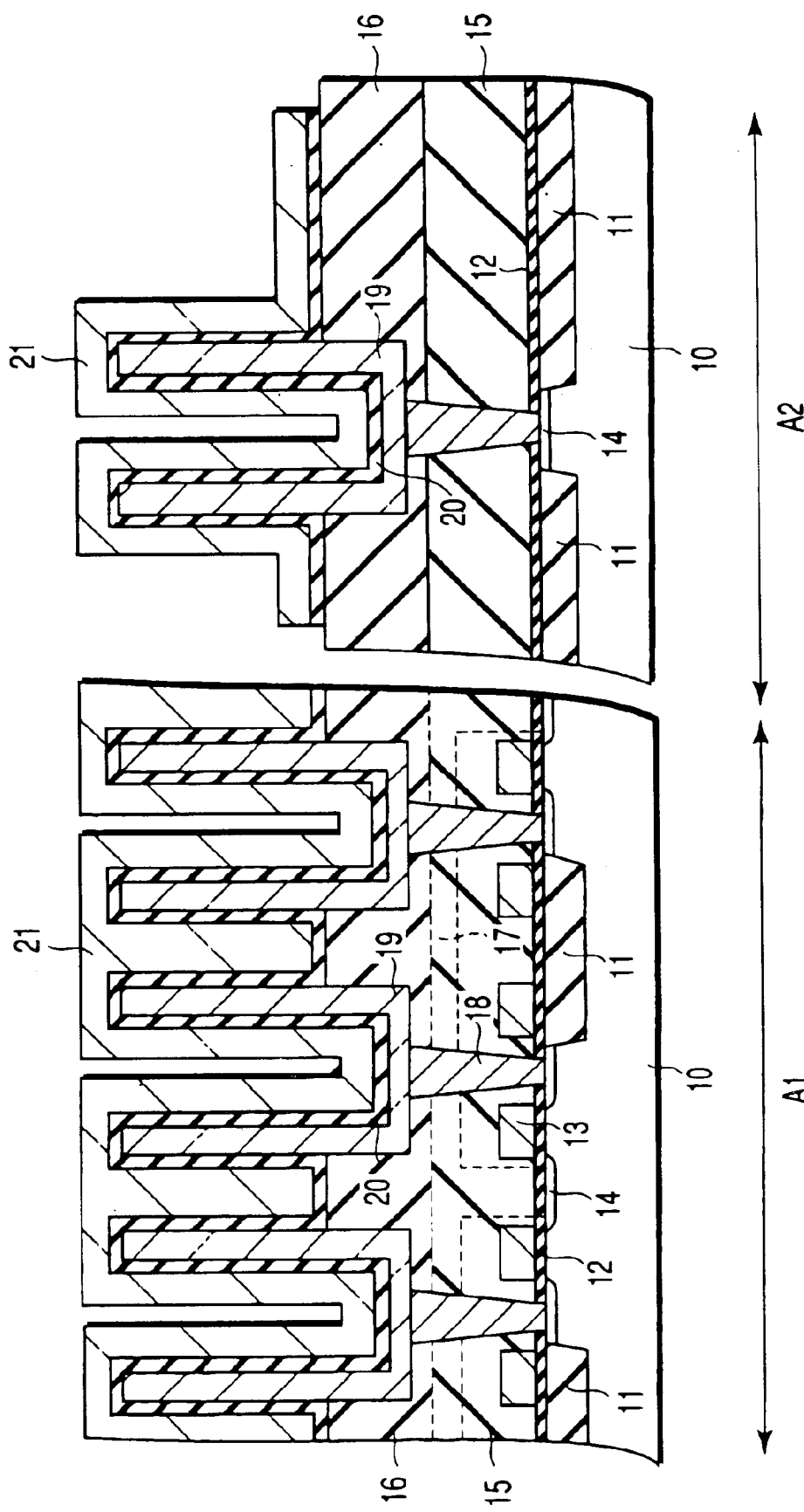
Figure 2C:
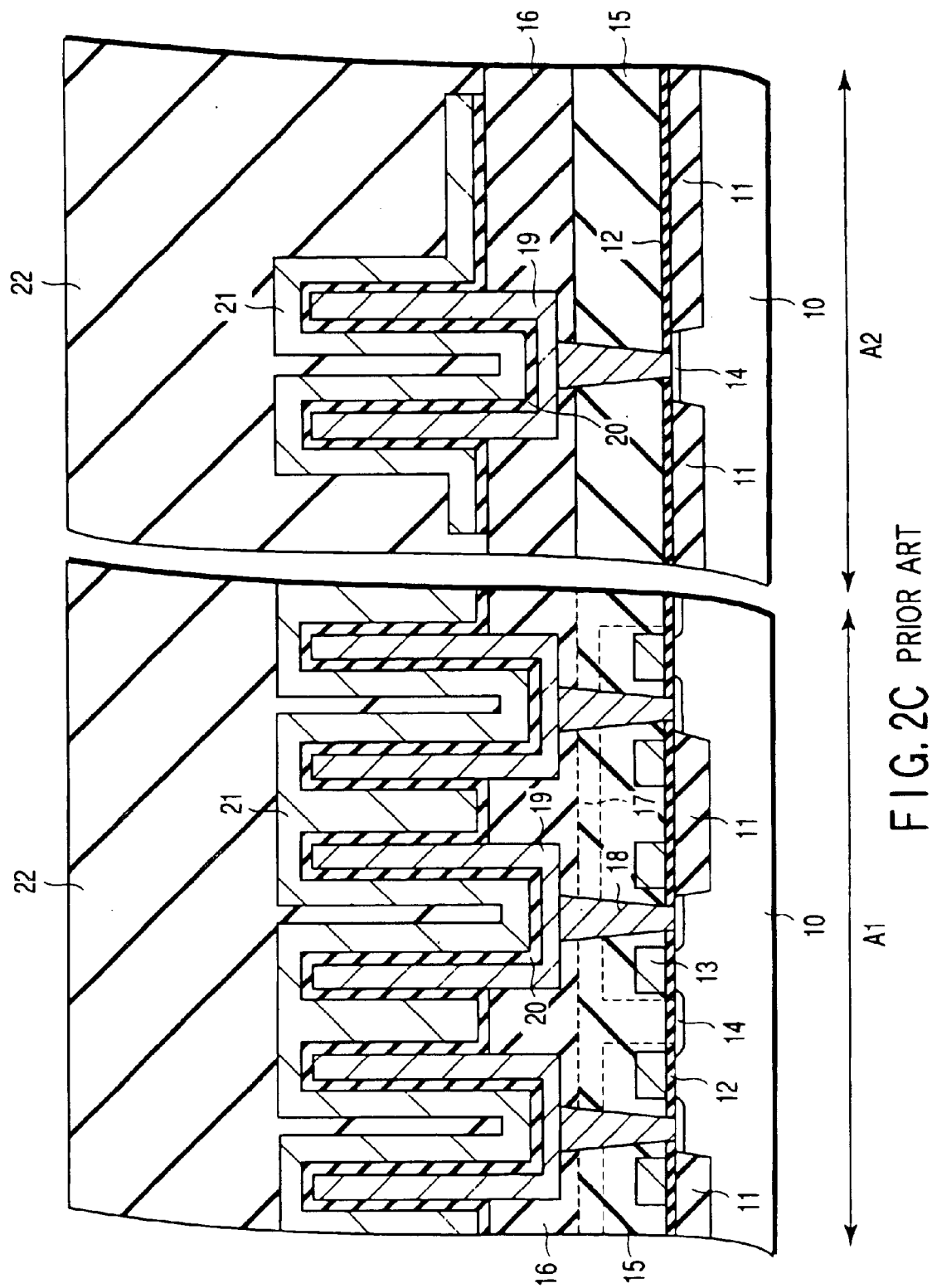
Figures 3A, 3B, 3C:
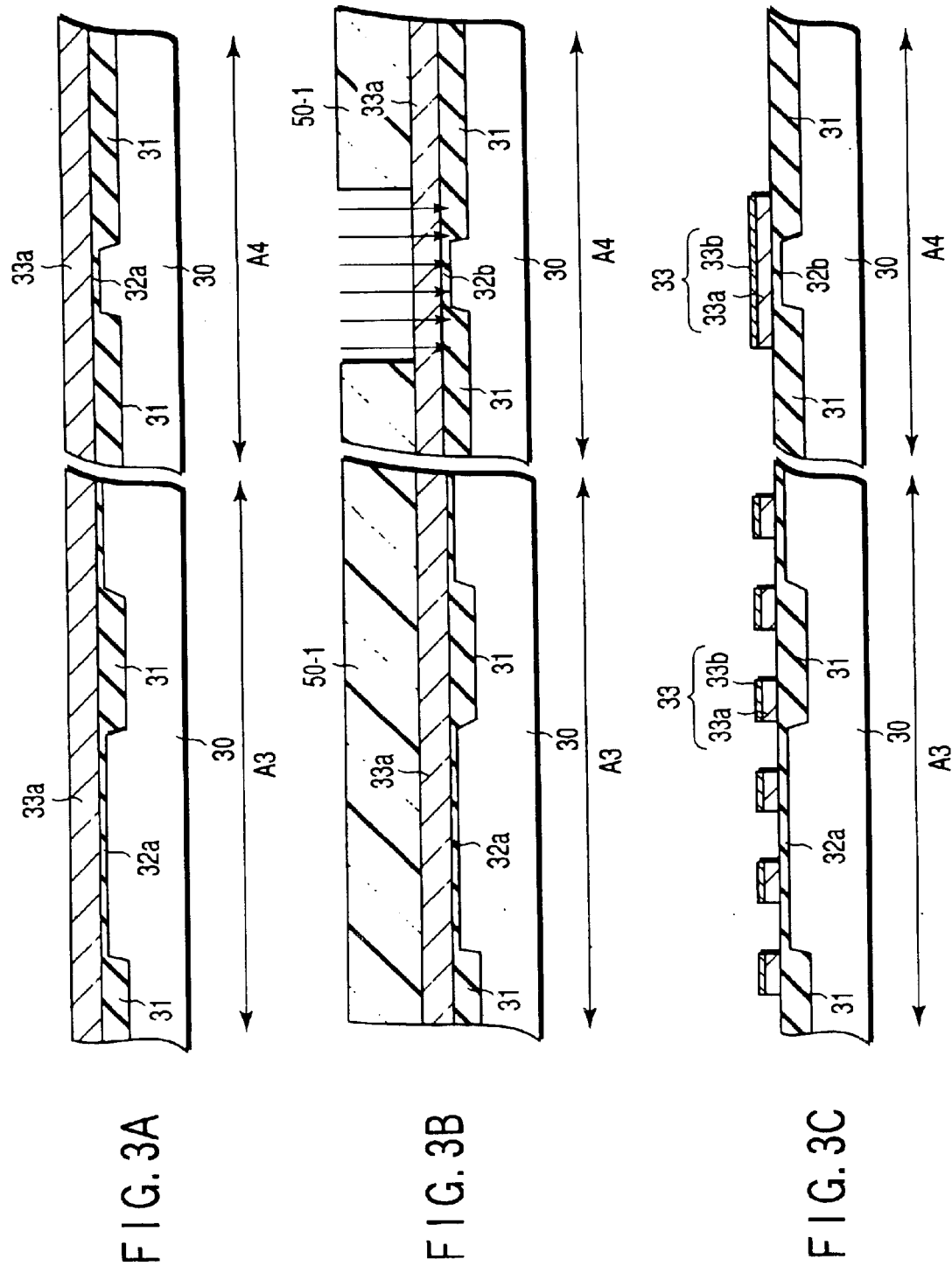
FIGS. 3A to 3C are cross-sectional views showing steps for manufacturing a semiconductor device having an anti-fuse utilizing a MOS structure, according to a first embodiment of the present invention.

A structure of the semiconductor device and a method for manufacturing the same according to a first embodiment of the present invention will be described with reference to FIGS. 3A to 3C. FIGS. 3A to 3C are cross-sectional views showing steps for manufacturing a semiconductor device having an anti-fuse utilizing a MOS structure.

First, as shown in FIG. 3A, an element isolating region 31 is formed in a circuit region A3 and a peripheral region A4 of a silicon substrate 30 by means of the conventional technique, such as STI (Shallow Trench Isolation). The circuit region is a region where essential circuit elements, such as MOS transistors, are to be formed, and the peripheral region is a region where anti-fuses are to be formed. A gate insulating film 32a is formed on the silicon substrate 30 by, for example, a dry oxidation method. Thereafter, a polycrystalline silicon film 33a, to be a part of a gate electrode, is formed on the gate insulating film 32a by means of CVD (Chemical Vapor Deposition) or the like. Then, impurities in accordance with n-channel and p-channel MOS transistors are introduced in the polycrystalline silicon film 33a.

Thereafter, a resist 50-1 is formed on the polycrystalline silicon film 33a. The resist 50-1 is patterned by means of lithography, thereby exposing a portion of the polycrystalline silicon film 33a in an anti-fuse forming region of the peripheral region A4. Then, as shown in FIG. 3B, an impurity such as arsenic, phosphorus or boron is ion-injected in a dose of the $10^{13}$ to $10^{15}$ cm$^{-3}$ order. The acceleration voltage at the ion injection is adjusted so that the impurity ions can be implanted into the gate insulating film 32a through the polycrystalline silicon film 33a. This step forms a gate insulating film 32b doped with the impurity in the peripheral region A4. The impurity to be injected to the gate insulating film is not limited to the above elements in particular, but may be any other element that can lower the dielectric breakdown resistance of the gate insulating film.

Then, the resist 50-1 is removed, and a tungsten film 33b to serve as a part of a gate electrode is formed on the polycrystalline silicon film 33a by, for example, CVD or sputtering. The polycrystalline silicon film 33a and the tungsten film 33b are patterned by lithography and etching, thereby forming gate electrodes 33 as shown in FIG. 3C.

Thereafter, an impurity diffusion layer of a MOS transistor and an interlayer insulating film covering the MOS transistor are formed by the known technique. As a result, a semiconductor device is completed. In the semiconductor device as shown in FIG. 3C, a fuse capacitor comprising the silicon substrate 30, the gate insulating film 32b doped with the impurity and the gate electrode 33 forms an anti-fuse.

In the anti-fuse having the MOS structure as mentioned above, a high voltage is applied across the gate electrode 33 and the silicon substrate 30, resulting in dielectric breakdown of the gate insulating film 32b to bring about a conduction state, so that information can be written in the anti-fuse.

In the above structure and manufacturing method, the impurity is ion-injected into the gate insulating film, which serves as a capacitor insulating film of the fuse capacitor formed in the peripheral region A4. With this ion injection, the gate insulating film 32b of the fuse capacitor having a lower dielectric breakdown resistance as compared to that of the gate insulating film 32a of the MOS transistor is formed in the peripheral region A4. Consequently, the writing voltage in the anti-fuse can be low. Moreover, since the ion injection does not influence the gate electrode in the circuit region A3 at all, both a high dielectric breakdown resistance required for the MOS transistor and a low dielectric breakdown resistance required for the anti-fuse can be achieved. Further, the degree of reduction in dielectric breakdown resistance of the anti-fuse, i.e., the writing voltage, can be suitably set by controlling the kind of ions, the acceleration voltage or the dose in the ion injection step. Thus, the performance of the anti-fuse can be controlled independent of the MOS transistor. Therefore, the development of the anti-fuse can be proceeded with before the development of the MOS transistor is completed, resulting in a reduction in development period.

Figures 4A, 4B, 4C:
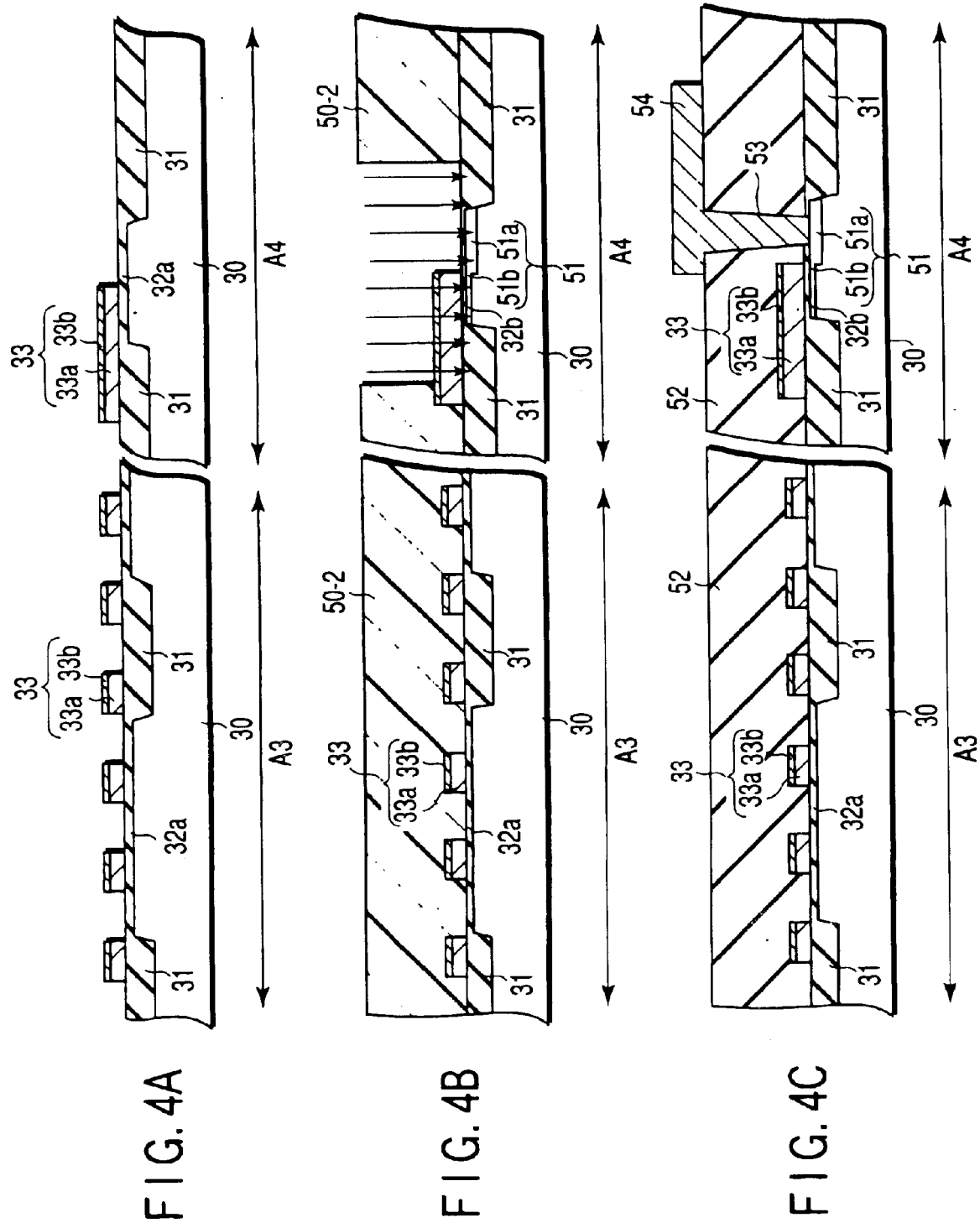
FIGS. 4A to 4C are cross-sectional views showing steps for manufacturing a semiconductor device having an anti-fuse utilizing a MOS structure, according to a second embodiment of the present invention.

A semiconductor device having an anti-fuse and a method for manufacturing the same according to a second embodiment of the present invention will be described with reference to FIGS. 4A to 4C. FIGS. 4A to 4C are cross-sectional views showing steps for manufacturing a semiconductor device having an anti-fuse of a MOS structure.

First, as shown in FIG. 4A, an element isolating region 31 is formed in a circuit region A3 and a peripheral region A4 of a p-type silicon substrate 30 by means of the conventional technique. A gate insulating film 32a is formed on the silicon substrate 30. Thereafter, a polycrystalline silicon film 33a, to be a part of a gate electrode, and a tungsten film 33b are formed on the gate insulating film 32a. Then, the polycrystalline silicon film 33a and the tungsten film 33b are patterned by lithography and etching, thereby forming gate electrodes 33. In the peripheral region A4, the gate electrode 33 does not cover all part of the element region. In other words, the gate electrode 33 is deliberately displaced to expose a part of the element region.

Thereafter, a resist 50-2 is formed on the silicon substrate 30, and then patterned to expose only a portion of the peripheral region by means of lithography. Then, as shown in FIG. 4B, an n-type impurity is ion-injected. The acceleration voltage at the ion injection is adjusted so that the impurity ions can be implanted into the gate insulating film 32a and the silicon substrate 30 through the tungsten film 33b and the polycrystalline silicon film 33a. Though this step, a gate insulating film 32b doped with the impurity is formed in the peripheral region A4; and an n-type impurity diffusion layer 51 is formed in the silicon substrate 30. As described above, the gate electrode 33 in the peripheral region A4 is displaced from the element region. Therefore, the impurity diffusion layer 51 formed in the silicon substrate 30 includes two impurity diffusion layers 51a and 51b of different depths. In other words, due to the ions passing through the gate electrode 33, the impurity diffusion layer 51b formed immediately under the gate electrode 33 is shallower than the impurity diffusion layer 51a, which is not covered by the gate electrode 33.

Then, impurity diffusion layers (not shown) to serve as source and drain regions of the MOS transistor are formed in the silicon substrate 30 by the conventional technique, and an interlayer insulating film 52 is formed on the silicon substrate 30, as shown in FIG. 4C. Thereafter, a contact hole 53 connected to the deeper impurity diffusion layer 51a is formed in the interlayer insulating film 52 in the peripheral region A4. Subsequently, a metal wiring layer 54 for burying the contact hole 53 is formed on the interlayer insulating film 52. Thus, an anti-fuse is completed.

In the anti-fuse having the MOS structure as described above, a high voltage is applied across the gate electrode 33 and the impurity diffusion layer 51b, resulting in dielectric breakdown of the gate insulating film 32b to bring about a conduction state, so that information can be written.

In the above structure and manufacturing method, an impurity of the opposite conductivity type to that of the silicon substrate 30 is introduced into the gate insulating film, which serves as a capacitor insulating film of the fuse capacitor, in order to lower the dielectric breakdown resistance of the gate insulating film. At the same time, the impurity is introduced into the silicon substrate 30 to form the impurity diffusion layer 51 to serve as a lower electrode of a fuse capacitor. Therefore, the second embodiment has an advantage that the size of the electric fuse can be considerably reduced in addition to the advantage obtained by the first embodiment. Thus, the second embodiment realizes an electric fuse suitable for an integrated circuit, which has been miniaturized and highly integrated.

Figure 5A:
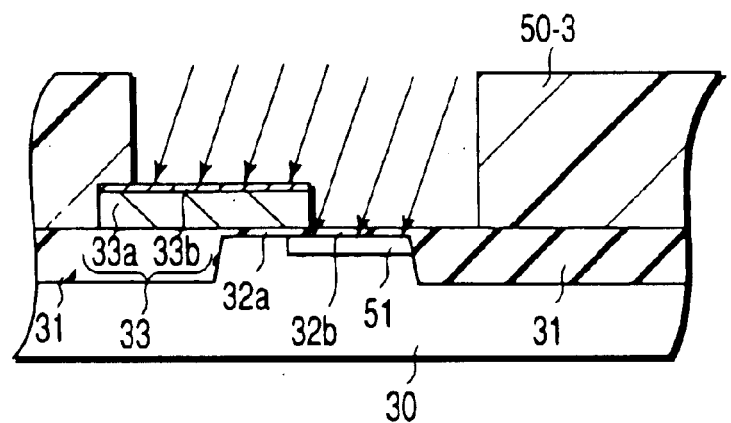
FIG. 5A is a cross-sectional view showing a step for manufacturing an anti-fuse utilizing a MOS structure, according to a third embodiment of the present invention.
Figure 5B:
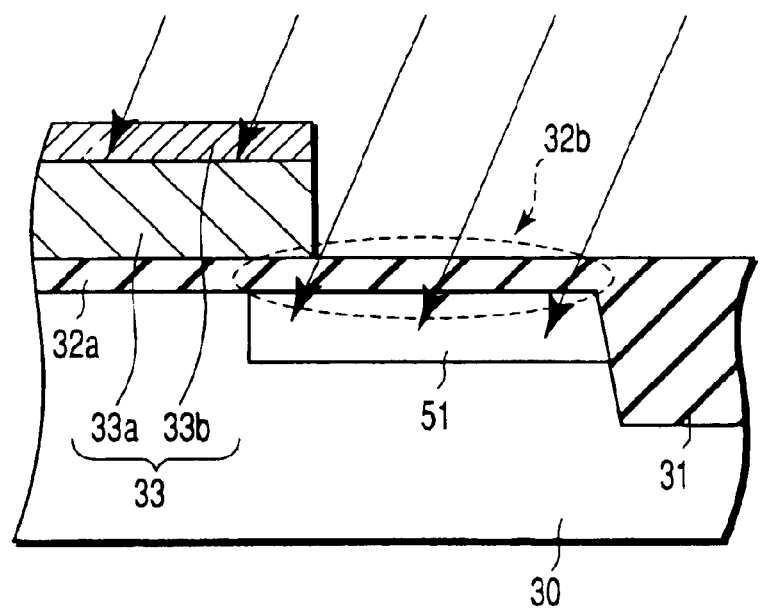
FIG. 5B is an enlarged view of FIG. 5A.
Figure 5C:
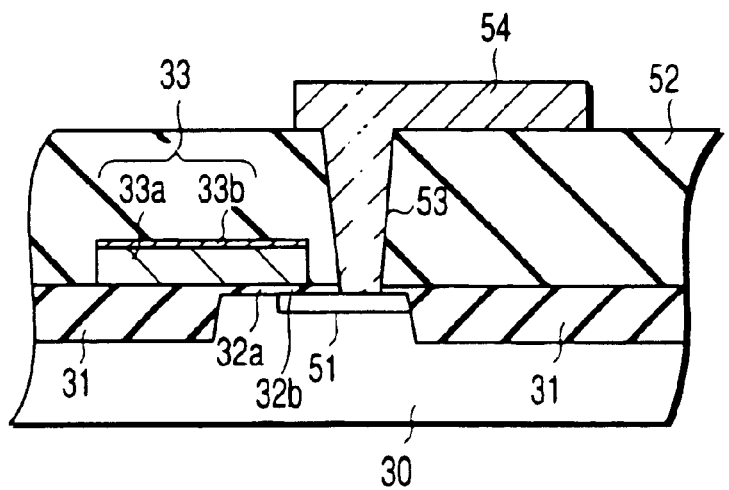
FIG. 5C is a cross-sectional view showing a step for manufacturing the anti-fuse utilizing the MOS structure, according to the third embodiment of the present invention.

A semiconductor device having an anti-fuse and a method for manufacturing the same according to a third embodiment of the present invention will be described with reference to FIGS. 5A to 5C. FIGS. 5A and 5C are cross-sectional views showing steps for manufacturing a semiconductor device having an anti-fuse of a MOS structure. FIG. 5B is an enlarged view of FIG. 5A. In FIGS. 5A to 5C, a circuit region is omitted to simplify explanations, and only a peripheral region is shown in which an anti-fuse is to be formed.

First, the structure shown in FIG. 4A of the second embodiment is formed by the conventional technique. In the peripheral region, the gate electrode 33, to be one of the electrodes of an anti-fuse, is deliberately displaced so as not to cover all part of the element region.

Then, a resist 50-3 is formed on the silicon substrate 30, and patterned by lithography to expose only the peripheral region. Thereafter, as shown in FIG. 5A, an n-type impurity is ion-injected with an acceleration voltage adjusted to such a level that ions cannot pass through the gate electrode 33. At this time, the impurity ions are injected obliquely from a direction at an angle with respect to the normal to the silicon substrate. As a result, the ions are implanted in the regions of the gate insulating film 32 where the gate electrode 33 is not formed and under the edge of the gate electrode 33, and the p-type silicon substrate 30 under those regions of the gate insulating film 32 mentioned above. Consequently, as shown in FIG. 5B, the gate insulating film 32a immediately under the edge portion of the gate electrode 33 is changed to the gate insulating film 32b having a lower dielectric breakdown resistance. In addition, an impurity diffusion layer 51, extending to a portion immediately under the edge portion of the gate electrode 33, is formed in the silicon substrate 30.

Thereafter, as shown in FIG. 5C, an interlayer insulating film 52 is formed on the silicon substrate 30 by the conventional technique. A contact hole 53 connected to the impurity diffusion layer 51 is formed in the interlayer insulating film 52. Subsequently, a metal wiring layer 54 for burying the contact hole 53 is formed. Thus, an anti-fuse is completed.

In the anti-fuse having the MOS structure as described above, a high voltage is applied across the gate electrode 33 and the impurity diffusion layer 51, resulting in dielectric breakdown of the gate insulating film 32b to bring about a conduction state, so that information can be written.

In the above structure and manufacturing method, an impurity of the opposite conductivity type to that of the silicon substrate 30 is ion-injected. With this ion injection, the dielectric breakdown resistance of the gate insulating film is lowered. In addition, the impurity diffusion layer 51 to serve as a lower electrode of a fuse capacitor is formed in the silicon substrate 30. The ion is injected obliquely on the condition that the ions do not pass through the gate electrode 33. Therefore, in the gate insulating film existing just under the gate electrode 33, the impurity is injected only into the region just under the edge portion of the gate electrode 33. In general, an electrical field concentrates on the edge portion of the gate electrode 33. Therefore, an electrical breakdown occurs more easily in the gate insulating film just under the edge portion as compared to the gate insulating film under the central portion of the gate electrode 33. Therefore, in the case where an impurity is ion-injected to the overall region of the gate insulating film as in the case of the second embodiment, this characteristic of the gate insulating film must be taken into consideration. More specifically, the dielectric breakdown resistance may not be too low in the gate insulating film under the edge portion of the gate electrode 33 and not be too high in the gate insulating film under the central portion thereof. Thus, the characteristics must be controlled in consideration of two regions. However, according to third embodiment, since only the portion of the gate insulating film just under the edge portion of the gate electrode is deteriorated, the characteristics may be controlled only in consideration of this region. For this reason, the third embodiment has an advantage that the condition of the ion injection can be optimized easily, resulting in low cost in manufacturing of the semiconductor device, in addition to the advantage of the second embodiment.

Figure 6A:
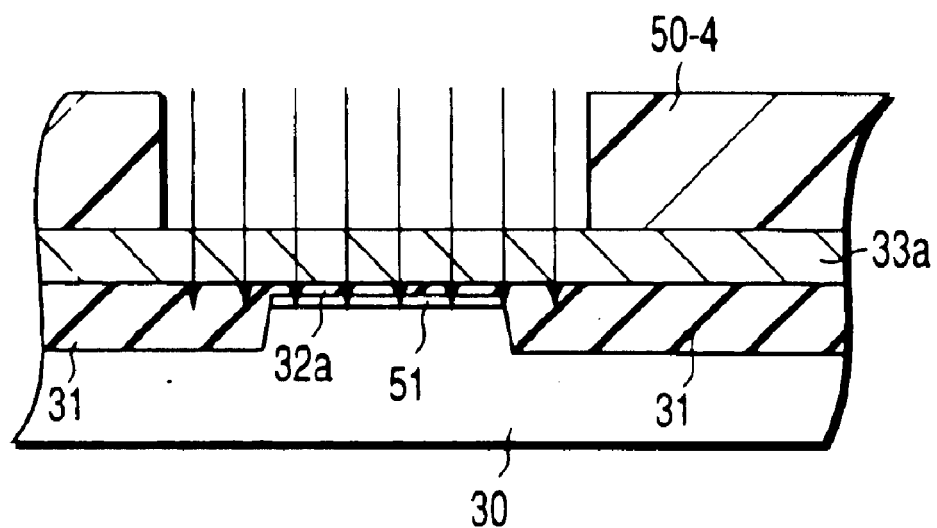
FIGS. 6A and 6B are cross-sectional views showing steps for manufacturing an anti-fuse utilizing a MOS structure, according to a fourth embodiment of the present invention.
Figure 6B:
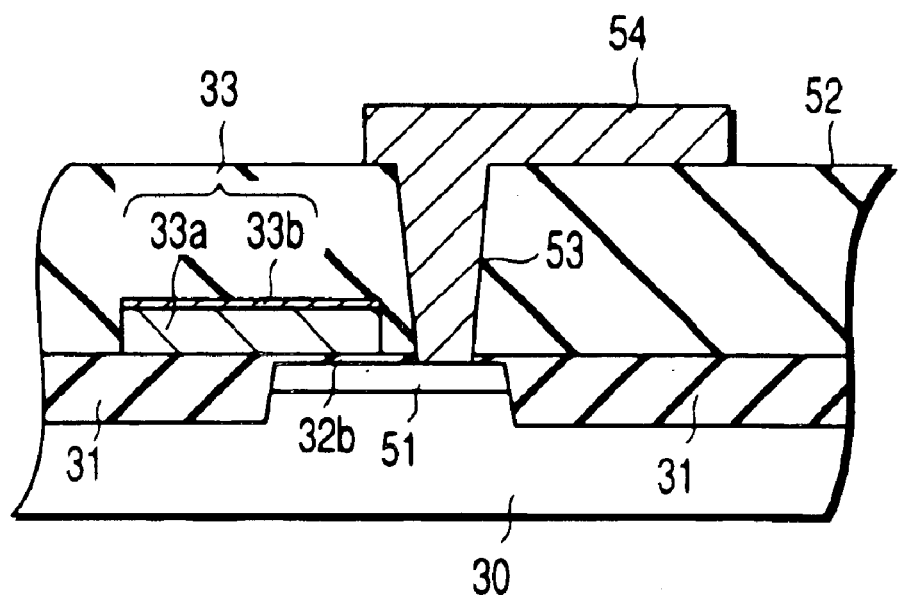

A semiconductor device having an anti-fuse and a method for fabricating the same according to a fourth embodiment of the present invention will be described with reference to FIGS. 6A and 6B. FIGS. 6A and 6B are cross-sectional views showing steps for manufacturing a semiconductor device having an anti-fuse of a MOS structure. In the drawings, a circuit region is omitted to simplify explanations, and only a peripheral region is shown in which an anti-fuse is to be formed.

First, the structure shown in FIG. 3A of the first embodiment is formed by the conventional technique. A resist 50-4 is formed on the polycrystalline silicon film 33a, and patterned by lithography to expose only the peripheral region in which an anti-fuse is to be formed.

Then, as shown in FIG. 6A, an impurity of the opposite conductivity type to that of the silicon substrate 30 is ion-injected. At this time, the ion injection is carried out with an acceleration voltage adjusted to such a level that the impurity can be implanted in the gate insulating film 32a and the silicon substrate 30 through the polycrystalline silicon film 33a. With this process, a gate insulating film 32b doped with the impurity and an impurity diffusion layer 51 in the silicon substrate 30 are formed in the peripheral region. The impurity diffusion layer 51 functions as one of the electrodes of an anti-fuse.

Thereafter, the resist 50-4 is removed and a tungsten film 33b to be a part of the gate electrode is formed on the polycrystalline silicon film 33a. Then, as shown in FIG. 6B, the polycrystalline silicon film 33a and the tungsten film 33b are patterned by means of lithography and etching. In other words, these films are processed to form a gate electrode 33 that does not entirely cover an element region. Subsequently, an impurity diffusion layer of a MOS transistor is formed in the silicon substrate 30 by the conventional technique. An interlayer insulating film 52 is formed on the silicon substrate 30. Then, a contact hole 53 connected to the impurity diffusion layer 51 of the anti-fuse is formed in the interlayer insulating film 52. Subsequently, a metal wiring layer 54 for burying the contact hole 53 is formed, with the result that an anti-fuse is completed.

In the anti-fuse having the MOS structure as described above, a high voltage is applied across the gate electrode 33 and the impurity diffusion layer 51, resulting in dielectric breakdown of the gate insulating film 32b to bring about a conduction state, so that information can be written.

In the above structure and manufacturing method, an anti-fuse having advantages of both the first and second embodiments can be obtained. In the fourth embodiment, as described above, the impurity is introduced into the gate insulating film of the fuse capacitor, which is to serve as an anti-fuse, thereby lowering the dielectric breakdown resistance of the gate insulating film. At the same time, the impurity of the conductivity type opposite to that of the silicon substrate is introduced to form an impurity diffusion layer, which is to serve as one of the electrodes. For this reason, the writing voltage of the anti-fuse can be lowered, while the size thereof can be very small. Thus, the fourth embodiment realizes an electric fuse suitable for an integrated circuit, which has been miniaturized and highly integrated. In addition, since the ion injection need not pass through the tungsten film, the ion injecting conditions, such as the kind of ions, the acceleration voltage and the dose, can be set easily, resulting in reduction in manufacturing cost.

A semiconductor device having an anti-fuse and a method for fabricating the same according to a fifth embodiment of the present invention will be described with reference to FIGS. 7A to 7D. FIGS. 7A to 7D are cross-sectional views showing steps for manufacturing a DRAM. In the DRAM of this embodiment, a stack capacitor of double-sided cylinder type is used as a cell capacitor, and the structure of the cell capacitor is utilized for an anti-fuse.

Figure 7A:
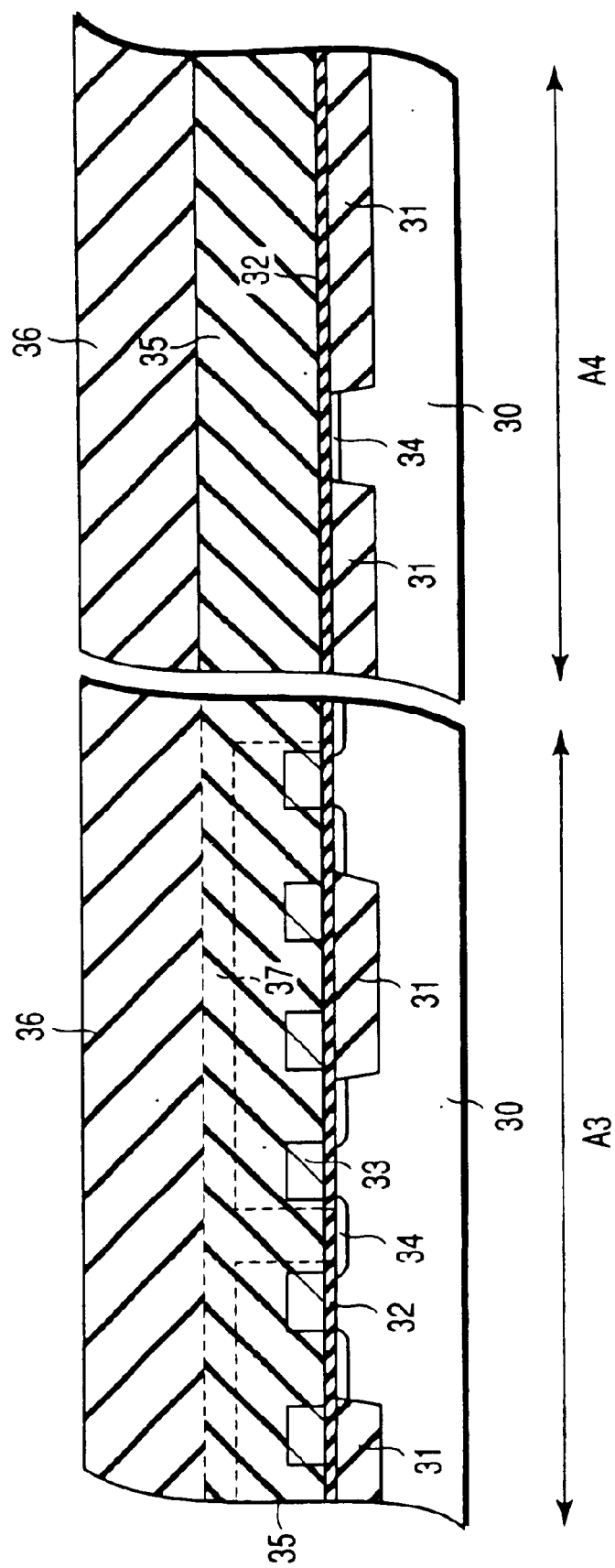
FIGS. 7A to 7D are cross-sectional views showing steps for manufacturing an anti-fuse utilizing a cell capacitor structure, according to a fifth embodiment of the present invention.

First, as shown in FIG. 7A, an element isolating region 31 is formed in a memory cell array region A3 and a peripheral region A4 of a silicon substrate 30 by means of the conventional technique. Then, gate electrodes (word lines) 33 are formed on the gate insulating film 32 in the memory cell array region A3. Further, impurity diffusion layers 34, which are to be source and drain regions, are formed between adjacent gate electrodes 33 in the silicon substrate 30. Thus, a cell transistor is completed. The diffusion layer 34 is also formed in the peripheral region A4, connecting with one of the electrodes of a fuse capacitor.

Thereafter, an interlayer insulating film 35 for covering the above cell transistor is formed on the silicon substrate 30. The interlayer insulating film 35 is formed of a material having an excellent step-coverage property, for example, a BPSG (Boron Phosphorous Silicate Glass) film or a silicon oxide film made of TEOS (tetraethylorthosilicate; Si(OC$_2$H$_5$)$_4$). A bit line 37 connected to the drain region of the cell transistor is formed in the interlayer insulating film 35. An interlayer insulating film 36 is deposited on the interlayer insulating film 35.

Figure 7B:
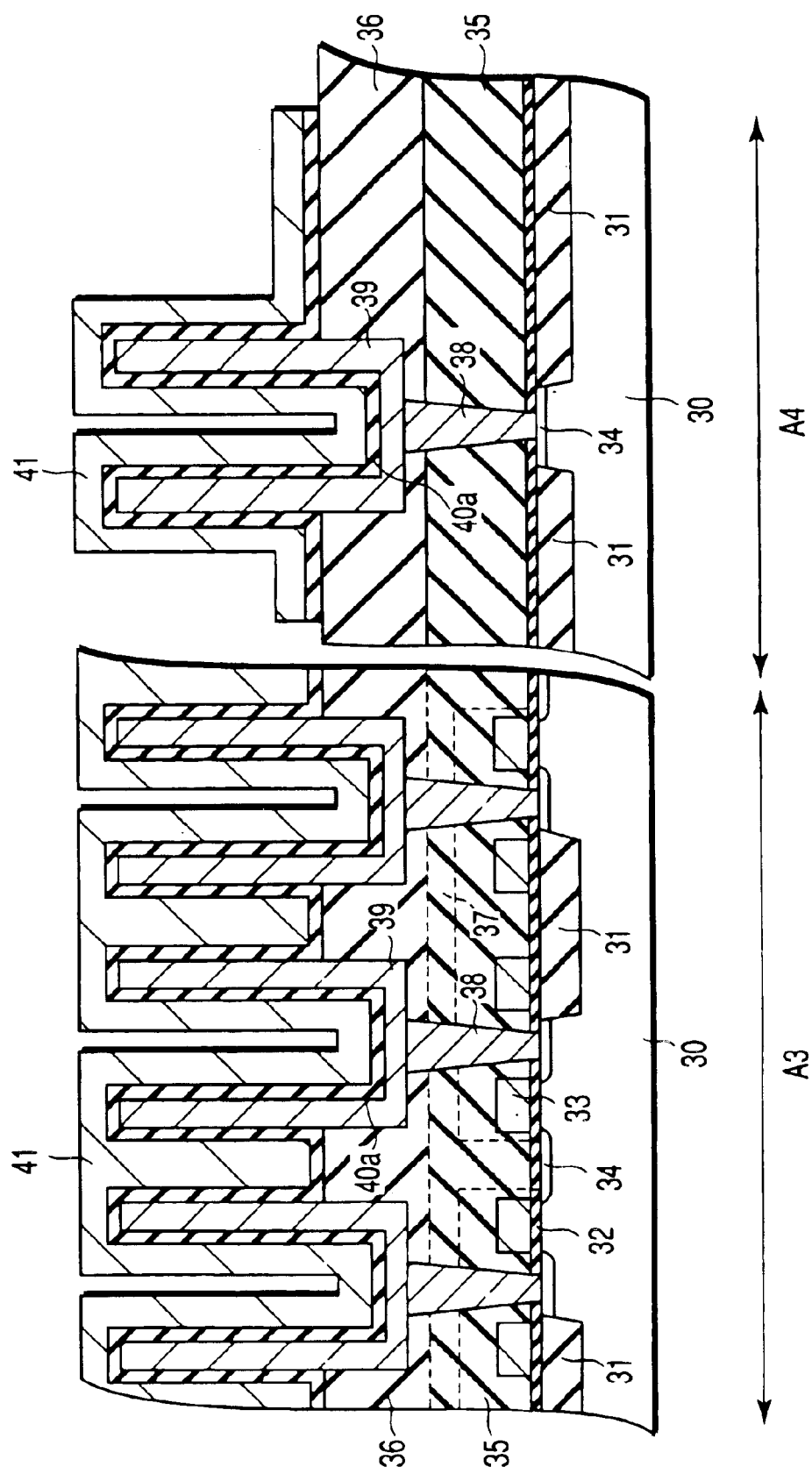

Then, as shown in FIG. 7B, contact plugs 18 connected to the impurity diffusion layer 34 in the peripheral region A4 and the source region of the cell transistor are formed in the interlayer insulating films 35 and 36. Subsequently, capacitor lower electrodes 39 of double-sided cylinder type connected to the contact plugs 18 are formed on the interlayer insulating film 36. Further, a capacitor insulating film 40a and a capacitor upper electrode 41 are successively formed on the capacitor lower electrodes 39. The capacitor insulating film 40a and the capacitor upper electrode 41 are patterned to a desired wiring pattern. Through this process, a cell capacitor and a fuse capacitor are formed respectively in the memory cell array region A3 and the peripheral region A4.

Figure 7C:
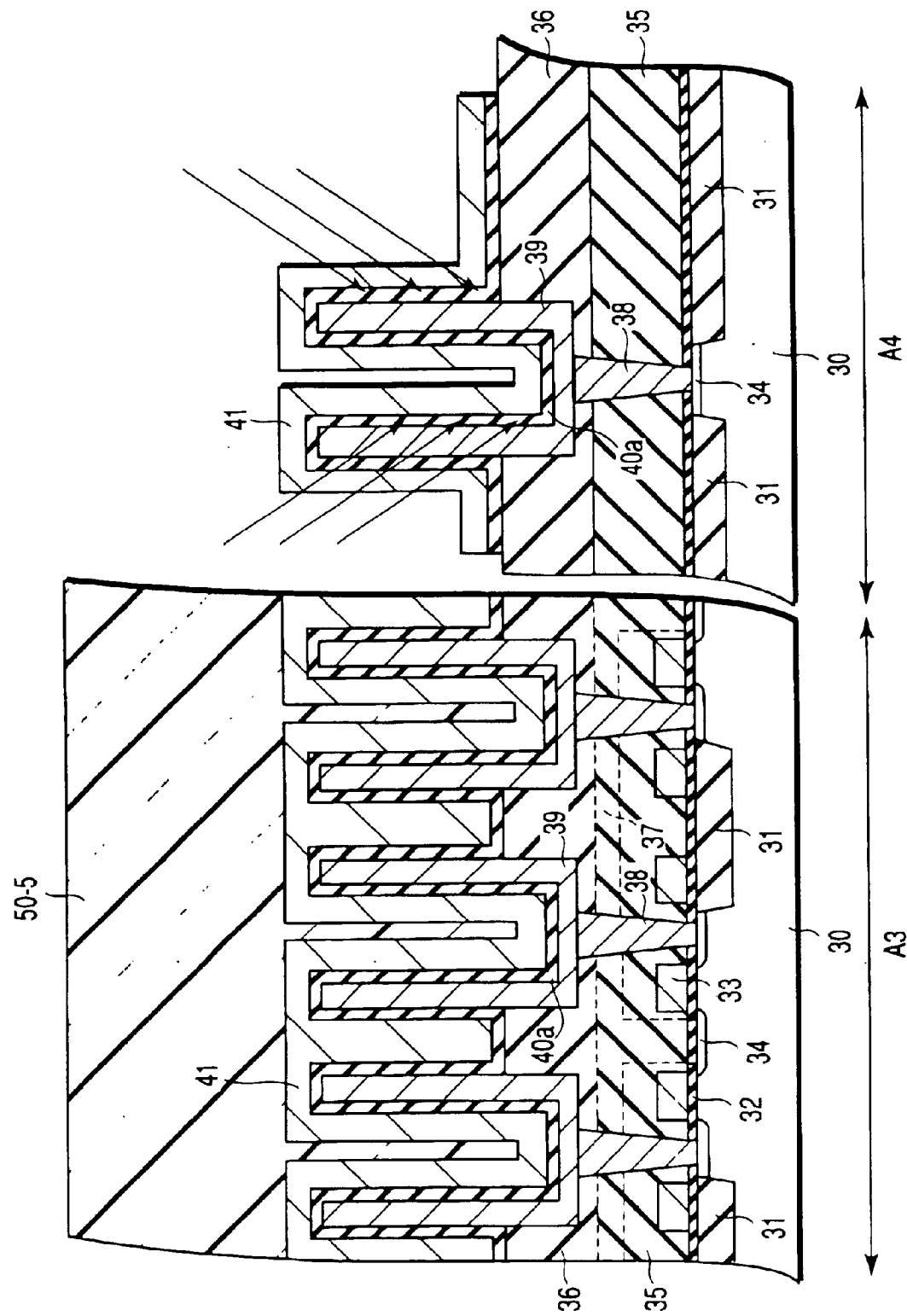

Thereafter, a resist 50-5 for covering the cell capacitor and the fuse capacitor is formed on the interlayer insulating film 36. Then, that part of the resist 50-5, in which an anti-fuse is to be formed in the peripheral region A4, is removed by lithography. Using the resist 50-5 as a mask, an impurity such as arsenic, phosphorous or boron is ion-injected, as shown in FIG. 7C. At this time, ions are injected from an oblique direction with an acceleration voltage adjusted to such a level that the ions can be implanted in the capacitor insulating film 40a through the capacitor upper electrode 41. Through this process, a capacitor insulating film 40b doped with the impurity is formed in the peripheral region A4. The impurity to be injected to the capacitor insulating film 40a is not limited to the above elements in particular, but may be any other element that can lower the dielectric breakdown resistance of the capacitor insulating film 40a. In this embodiment, the ions are injected from an oblique direction. The ions may be injected in any direction as far as the impurity is implanted in at least a part of the capacitor insulating film 40a.

Then, the resist 50-5 is removed by, for example, ashing. An interlayer insulating film 42 for covering the cell capacitor and the fuse capacitor is formed by the conventional art on the interlayer insulating film 36. Thereafter, a metal wiring layer 44 connected to the capacitor upper electrode 41 via a contact plug 43 is formed on the interlayer insulating film 42. An interlayer insulating film 45 is formed on the interlayer insulating film 42. Consequently, a DRAM having the structure as shown in FIG. 7D is completed.

Figure 8A:
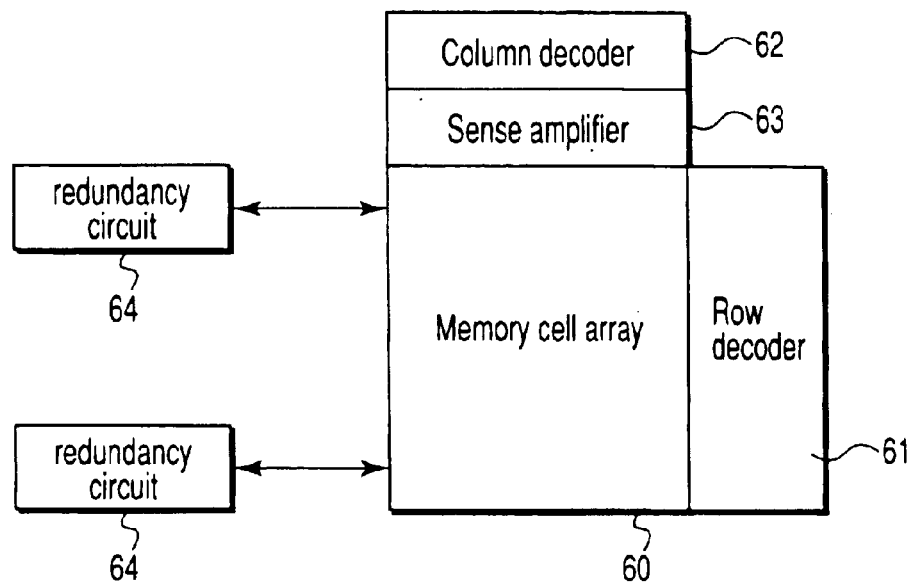
FIGS. 8A and 8B are block diagrams showing the internal circuits of a DRAM.
Figure 8B:
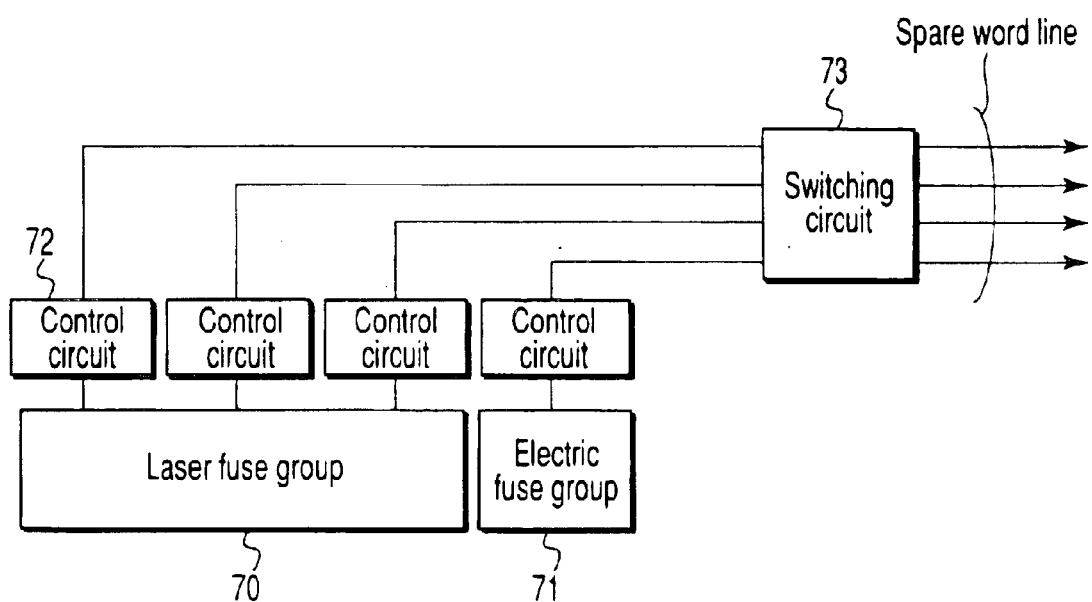

A circuit configuration of the DRAM produced by the above method will be described with reference to FIGS. 8A and 8B. FIGS. 8A and 8B are block diagrams showing parts of the structures of internal circuits of the DRAM.

Figure 7D:
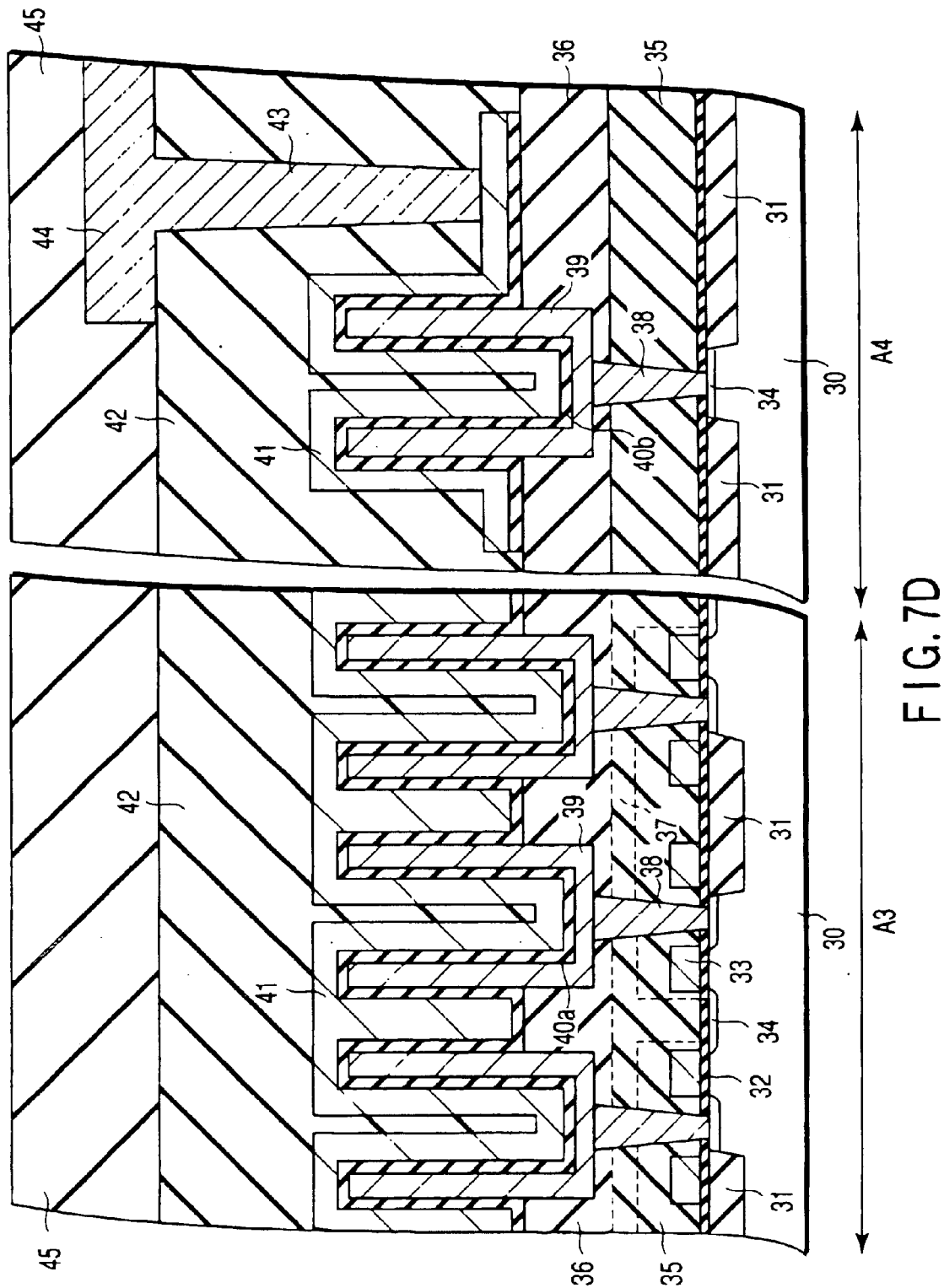

A semiconductor chip comprising the DRAM has a memory cell array 60 having the structure as shown in FIG. 7D, a row decoder 61, a column decoder 62, a sense amplifier 63 and redundancy circuits 64.

The row decoder 61 selects one of the word lines in the memory cell array 60 and the column decoder 62 selects one of the bit lines in the memory cell array 60. The sense amplifier 63 amplifies a signal read out from a memory cell of the memory cell array 60. The redundancy circuit 64 replaces a defective memory cell of the memory cell array 60 with a spare cell.

FIG. 8B is a block diagram showing a part of the circuit configuration of the redundancy circuit 64. As shown in FIG. 8B, the redundancy circuit 64 comprises fuse groups consisting of a laser fuse group 70 and an electric fuse group 71, control circuits 72 connected to the respective fuses, and a switching circuit 73 for selecting one of the control circuits 72. Each electric fuse in the electric fuse group 71 is an anti-fuse having the structure as shown in FIG. 7D. Outputs of the switching circuit 83 are spare word lines connected to spare memory cells provided in the memory cell array 60. The control circuit 72 is, for example, a defect address register. The information corresponding to the defect addresses are written in the fuses. When a defect address is accessed, the switch circuit 73 selects a spare word line corresponding to the defect address.

In the anti-fuse of the DRAM as described above, a high voltage is applied across the capacitor lower electrode 39 and the capacitor upper electrode 41, resulting in dielectric breakdown of the capacitor insulating film 40b, so that information can be written in the anti-fuse.

In the DRAM having the above structure produced by the method described above, the impurity is injected into the capacitor insulating film of the fuse capacitor, which serves as the anti-fuse. As a result, the dielectric breakdown resistance of the fuse capacitor can be lower than that of the cell capacitor. Therefore, information can be written into the anti-fuse with a lower voltage. Further, the degree of reduction in dielectric breakdown resistance can be controlled in accordance with the kind of ions, the acceleration voltage or the dose in the ion injection step. As a result, it is possible to achieve both a high dielectric breakdown resistance required for the essential capacitor element and a low dielectric breakdown resistance required for the fuse capacitor. Thus, the performance of the DRAM can be improved. Moreover, the performance of the fuse capacitor can be controlled according to only the ion injection conditions. In other words, the performance of the fuse capacitor can be controlled independent of the cell capacitor. Therefore, the development of the fuse capacitor can be proceeded with before the development of the cell capacitor is completed, resulting in a reduction in development period of the DRAM.

According to the first to fifth embodiments, the dielectric breakdown resistance of the anti-fuse is lowered by injecting an impurity into the insulating film of the fuse capacitor constituting the anti-fuse. As a result, the writing voltage of the anti-fuse can be lowered. The impurity injected into the insulating film is preferably arsenic, phosphorus or boron, which are generally used in silicon devices, since it is easy to set ion injection conditions. However, the impurity to be injected to the gate insulating film is not limited to the above elements in particular, but may be any other element that can lower the dielectric breakdown resistance, for example, silicon or argon.

The impurity can be introduced into the insulating film by ion injection. The characteristics of the anti-fuse can be set freely only depending on the conditions of the ion injection. Further, the step of forming the capacitor structure may be separated from the step of setting the breakdown resistance of the anti-fuse. Therefore, when the capacitor structure is formed, it is only necessary to consider characteristics of essential elements (MOS transistors and cell capacitors); that is, the characteristics of the anti-fuse need not be taken into consideration. Therefore, these elements may have a sufficiently high dielectric breakdown resistance as essentially required. On the other hand, the dielectric breakdown resistance of only the anti-fuse can be lowered by ion-injecting an impurity into the insulating film of the capacitor structure that has a high dielectric breakdown resistance required for the essential elements, so that the writing voltage can be controlled freely. Thus, although the capacitors have the same structures with the insulating films of the same thickness, their dielectric breakdown resistances can be controlled independent of each other. Consequently, the semiconductor can be developed under relaxes conditions.

Further, as described above, since the characteristics of the anti-fuse almost entirely depend on the conditions of the ion injection, the anti-fuse can be developed independently. In other words, in the case of the DRAM, the development of the anti-fuse can be started before the development of the cell capacitor is completed. Thus, the period of development of a semiconductor device can be reduced.

According to the second to fourth embodiments, when the ions are injected to deteriorate the gate insulating film, the impurity diffusion layer, formed in the silicon substrate, is used as an electrode of the anti-fuse. Therefore, the area occupied by the anti-fuse can be small, and the miniaturization and large-scale integration of the integrated circuit can be advanced.

In the first to fifth embodiments, the impurity is ion-injected into the capacitor insulating film of the fuse capacitor. The capacitor insulating film is deteriorated also by the impurity passing therethrough. Therefore, the ion injection may be carried out such that the impurity is implanted in the silicon substrate 30, passing through the gate insulating film 32a, instead of implanting the impurity in the gate insulating film 32a by the ion injection. In this method also, the gate insulating film 32b having a lowered dielectric breakdown resistance can be formed. The same applies to the fifth embodiment in which the cell capacitor structure is utilized to form the anti-fuse.

In the embodiments described above, the anti-fuse utilizes a part of the cell capacitor or the MOS transistor of a DRAM. However, the embodiment of the present invention is to control the dielectric breakdown resistance by introducing an impurity into the insulating film of the anti-fuse. Therefore, the embodiment of the present invention is not limited to the structures of the first to fifth embodiments. Other structures of the embodiments will be described below.

Figure 9A:
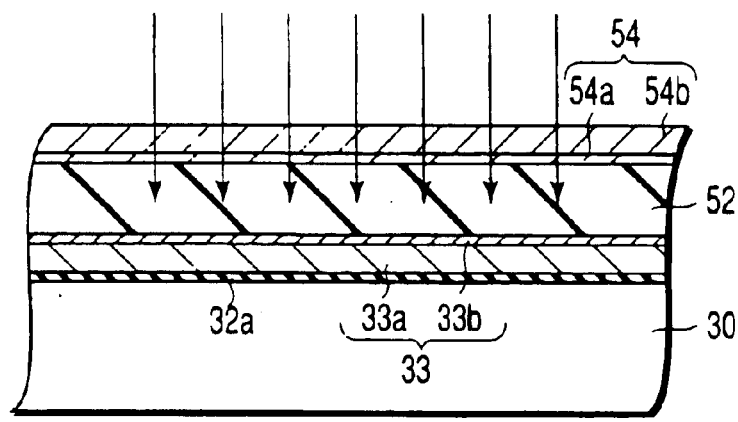
FIGS. 9A and 9B are cross-sectional views of semiconductor devices according to modifications of the embodiments of the present invention.
Figure 9B:
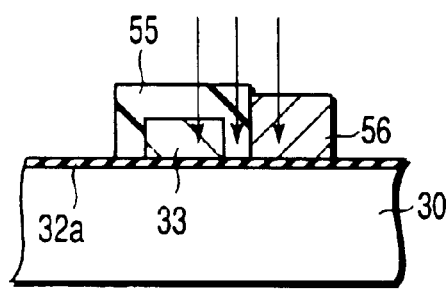
Figure 9C:
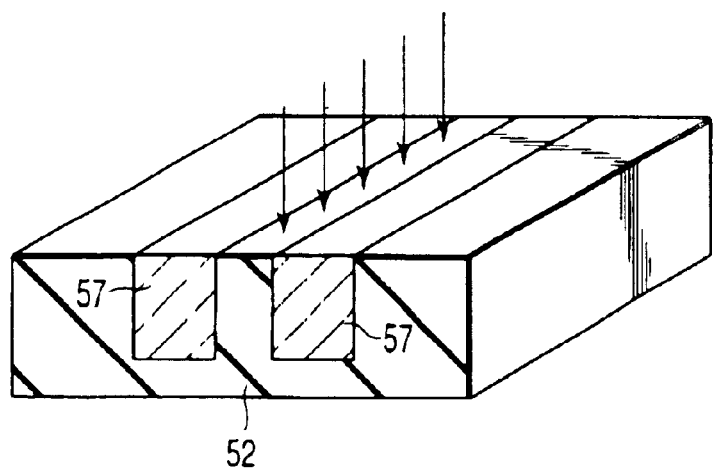
FIG. 9C is an exploded view of a semiconductor device according to another modification of the embodiments of the present invention.

FIGS. 9A to 9C show first to third modifications of the above embodiments. FIGS. 9A and 9B are cross-sectional views of anti-fuses and FIG. 9C is an exploded view of an anti-fuse.

FIG. 9A shows an anti-fuse using an interlayer insulating film. As shown in FIG. 9A, a polycrystalline silicon film 33a and a tungsten film 33b, serving as a gate electrode 33, are formed on a gate insulating film 32a, which is formed on a silicon substrate 30. An interlayer insulating film 52 is formed on the tungsten film 33b. A metal wiring layer 54 including a barrier metal layer 54a and a metal layer 54b is formed on the interlayer insulating film 52. This structure constitutes an anti-fuse in which the gate electrode 33 and the metal wiring layer 54 serve as capacitor electrodes and the interlayer insulating film 52 serves as a capacitor insulating film. The dielectric breakdown resistance, i.e., the writing voltage, of the anti-fuse can be controlled by ion-injecting an impurity into the interlayer insulating film 52 serving as the capacitor insulating film.

FIG. 9B shows an anti-fuse using a gate sidewall insulating film. As shown in FIG. 9B, a gate electrode 33 is formed on a silicon substrate 30 with a gate insulating film 32a interposed therebetween. A gate sidewall insulating film 55 covering the gate electrode 33 is provided. A metal wiring layer 56 abuts on the gate sidewall insulating film 55. This structure forms an anti-fuse in which the gate electrode 33 and the metal wiring layer 56 serve as capacitor electrodes and the gate sidewall insulating film 55 serves as a capacitor insulating film. The dielectric breakdown resistance, i.e., the writing voltage, of the anti-fuse can be controlled by ion-injecting an impurity into the gate sidewall insulating film 55 serving as the capacitor insulating film.

FIG. 9C shows an anti-fuse using an insulating film interposed between metal wiring layers. As shown in FIG. 9C, two metal wiring layers 57 are buried in an interlayer insulating film 52. An anti-fuse includes the metal wiring layers 57 serving as capacitor electrodes, and the portion of the interlayer insulating film 52 located between the two wiring layers 57, which serves as a capacitor insulting film. The dielectric breakdown resistance, i.e., the writing voltage, of the anti-fuse can be controlled by ion-injecting an impurity into the portion of the interlayer insulating film 52 located between the two metal wiring layers 57.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

capacitor structures, each having a first gate insulating film formed on a semiconductor substrate of a first conductivity type, and a first gate electrode formed on the first gate insulating film; and electric fuse elements, each having a second gate insulating film formed on the semiconductor substrate and having an impurity concentration higher than that of the first gate insulating film, and a second gate electrode formed on the second gate insulating film, wherein information is written in the electric fuse element depending on whether the second gate insulating film is dielectrically broken down, and a writing voltage of the electric fuse element is determined by dielectric breakdown resistance of the second gate insulating film which depends on the impurity concentration of the second gate insulating film;

an impurity diffusion layer of a second conductivity type, which is formed in at least a portion of the semiconductor substrate, the impurity diffusion layer being paired with the second gate electrode and serving as one electrode of the electric fuse element; and a leading electrode electrically connected to an extended portion of the impurity diffusion layer extending to a region of the semiconductor substrate where no second electrode exists.

2. The semiconductor device according to claim 1, wherein at least a part of the impurity diffusion layer is located directly underneath at least a part of the second gate electrode.

3. A semiconductor device comprising:

capacitor structures, each having a first gate insulating film formed on a semiconductor substrate of a first conductivity type, and a first gate electrode formed on the first sate insulating film;

electric fuse elements, each having a second gate insulating film formed on the semiconductor substrate and having an dielectric breakdown resistance lower than that of the first gate insulating film, and a second gate electrode formed on the second insulating film, an information being written in the electric fuse element depending on whether the second gate insulating film is dielectrically broken down, a writing voltage of the electric fuse element being determined by dielectric breakdown resistance of the second gate insulating film; and an impurity diffusion layer of a second conductivity type, which is formed in at least a portion of the semiconductor substrate, the impurity diffusion layer being paired with the second gate electrode and serving as one electrode of the electric fuse, the impurity diffusion layer being formed by impregnating an impurity of the second conductivity through the second gate insulating film into the semiconductor substrate, and the dielectric breakdown resistance of the second gate insulating layer being controlled by the impurity passing through the second gate insulating film; and a leading electrode electrically connected to an extended portion of the impurity diffusion layer extending to a region of the semiconductor substrate where no second electrode exists.

* * * * *

UNITED STATES PATENT AND TRADEMARK OFFICE
CERTIFICATE OF CORRECTION

PATENT NO. : 6,812,542 B2
DATED : November 2, 2004
INVENTOR(S) : Yusuke Kohyama

It is certified that error appears in the above-identified patent and that said Letters Patent is hereby corrected as shown below:

<u>Title page,</u>
Item [73], Assignee, please replace "Kamasaki" with -- Kawasaki --.

Signed and Sealed this

Twenty-third Day of August, 2005

JON W. DUDAS
*Director of the United States Patent and Trademark Office*